(12) United States Patent
Kim et al.

(10) Patent No.: US 11,158,671 B2
(45) Date of Patent: Oct. 26, 2021

(54) SEMICONDUCTOR DEVICES

(71) Applicant: SAMSUNG ELECTRONICS CO., LTD., Suwon-si (KR)

(72) Inventors: Yong-Jae Kim, Seongnam-si (KR); Kil-Ho Lee, Busan (KR); Dae-Eun Jeong, Yongin-si (KR); Gwan-Hyeob Koh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/435,915

(22) Filed: Jun. 10, 2019

(65) Prior Publication Data

US 2020/0127048 A1 Apr. 23, 2020

(30) Foreign Application Priority Data

Oct. 19, 2018 (KR) ........................ 10-2018-0124849

(51) Int. Cl.
| | |
|---|---|
| *H01L 43/02* | (2006.01) |
| *H01L 43/12* | (2006.01) |
| *H01L 27/22* | (2006.01) |
| *H01L 21/768* | (2006.01) |

(52) U.S. Cl.
CPC ...... *H01L 27/228* (2013.01); *H01L 21/76885* (2013.01); *H01L 43/02* (2013.01); *H01L 43/12* (2013.01)

(58) Field of Classification Search
CPC .............................. H01L 43/08; H01L 43/02
See application file for complete search history.

(56) References Cited

U.S. PATENT DOCUMENTS

| | | | |
|---|---|---|---|
| 8,148,174 B1 | 4/2012 | Abedifard et al. | |
| 9,087,983 B2 | 7/2015 | Guo | |
| 9,634,240 B2 | 4/2017 | Park et al. | |
| 9,893,271 B2 | 2/2018 | Park et al. | |
| 2017/0053965 A1* | 2/2017 | Baek | H01L 23/528 |
| 2018/0122854 A1 | 5/2018 | Lee et al. | |
| 2018/0123030 A1 | 5/2018 | Ha et al. | |
| 2018/0159023 A1 | 6/2018 | Suh et al. | |
| 2018/0182810 A1 | 6/2018 | Yi et al. | |
| 2018/0198059 A1* | 7/2018 | Ko | H01L 27/222 |
| 2020/0006634 A1* | 1/2020 | Brockman | H01L 23/528 |
| 2020/0106000 A1* | 4/2020 | Chiu | H01L 27/222 |

\* cited by examiner

*Primary Examiner* — Moazzam Hossain
(74) *Attorney, Agent, or Firm* — Lee IP Law, PC (57) ABSTRACT

A semiconductor device may include a conductive structure on a substrate, a contact plug on the conductive structure, and a magnetic tunnel junction structure on the contact plug. A lower surface of the contact plug may have an area greater than that of an upper surface thereof, and the contact plug may include a capping pattern at least partially covering an upper surface of the conductive structure, a conductive pattern on the capping pattern, and an amorphous metal pattern on the conductive pattern.

19 Claims, 12 Drawing Sheets

SEMICONDUCTOR DEVICES

CROSS-REFERENCE TO RELATED APPLICATION

Korean Patent Application No. 10-2018-0124849, filed on Oct. 19, 2018 in the Korean Intellectual Property Office (KIPO), and entitled: "Semiconductor Devices," is incorporated by reference herein in its entirety.

BACKGROUND

1. Field

Embodiments relate to semiconductor devices.

2. Description of the Related Art

In a semiconductor device, a contact plug may be formed on a conductive line.

SUMMARY

Embodiments are directed to a semiconductor device that includes a conductive structure on a substrate, a contact plug on the conductive structure, and a magnetic tunnel junction structure on the contact plug. A lower surface of the contact plug may have an area greater than that of an upper surface thereof, and the contact plug may include a capping pattern at least partially covering an upper surface of the conductive structure, a conductive pattern on the capping pattern, and an amorphous metal pattern on the conductive pattern.

Embodiments are also directed to a semiconductor device that includes first and second conductive structures on a cell region and a peripheral circuit region, respectively, of a substrate, a contact plug on the conductive structure, a magnetic tunnel junction structure on the contact plug, and a second capping pattern at least partially covering an upper surface of the second conductive structure. A lower surface of the contact plug may have an area greater than that of an upper surface thereof, and the contact plug may include a first capping pattern at least partially covering an upper surface of the first conductive structure, a first conductive pattern on the first capping pattern, and an amorphous metal pattern on the first conductive pattern.

Embodiments are also directed to a semiconductor device that includes a gate structure on a substrate, a source/drain layer on a portion of the substrate adjacent to the gate structure, a conductive structure electrically connected to the source/drain layer, a contact plug on the conductive structure, and a magnetic tunnel junction structure on the contact plug. A lower surface of the contact plug may have an area greater than that of an upper surface thereof, and the contact plug may include a capping pattern at least partially covering an upper surface of the conductive structure, a conductive pattern on the capping pattern, and an amorphous metal pattern on the conductive pattern.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, two directions substantially parallel to an upper surface of a substrate and intersecting with each other are defined as first and second directions, respectively. In an example embodiment, the first and second directions may be substantially orthogonal to each other.

FIGS. 1 to 8 are cross-sectional views illustrating a method of manufacturing a semiconductor device in accordance with an example embodiment.

Figure 1:
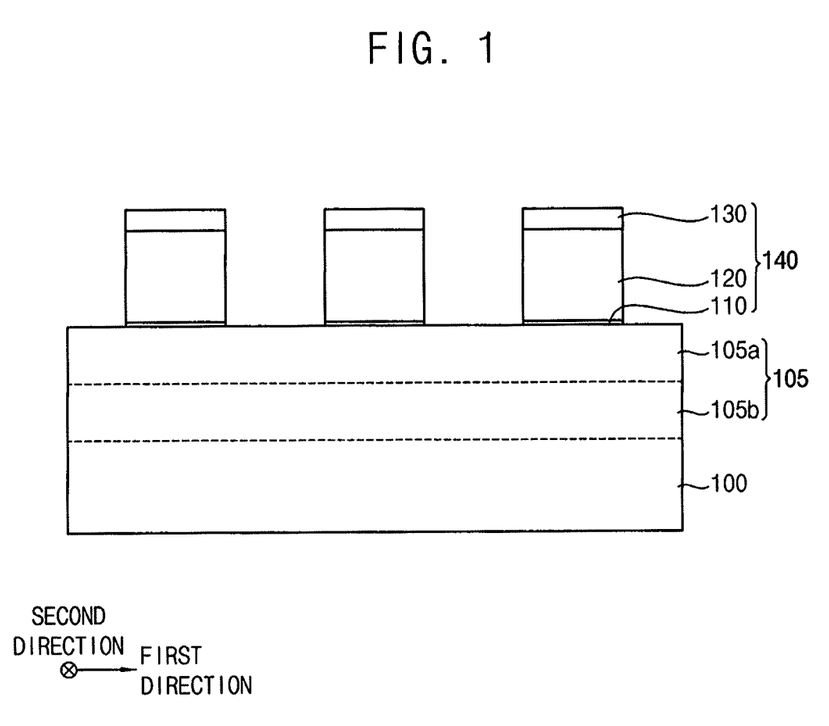
FIGS. 1 to 8 illustrate cross-sectional views of a method of manufacturing a semiconductor device in accordance with an example embodiment.

Referring to FIG. 1, an active fin 105 may be formed on a substrate 100, and a dummy gate structure 140 may be formed on the active fin 105.

In an example embodiment, the substrate 100 may include a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The active fin 105 may be formed by partially etching an upper portion of the substrate 100, and a lower sidewall of the active fin 105 may be covered by an isolation pattern. The isolation pattern may include an oxide, e.g., silicon oxide.

The active fin 105 may include a lower active pattern 105b of which a sidewall may be covered by the isolation pattern, and an upper active pattern 105a upwardly protruding from the isolation pattern. In an example embodiment, the active fin 105 may extend in the first direction, and a plurality of active fins 105 may be formed along the second direction.

The dummy gate structure 140 may be formed by sequentially forming a dummy gate insulation layer, a dummy gate electrode layer and a dummy gate mask layer on the active fin 105 and the isolation pattern, patterning the dummy gate mask layer to form a dummy gate mask 130, and sequentially etching the dummy gate electrode layer and the dummy gate insulation layer thereunder using the dummy gate mask 130 as an etching mask. Accordingly, the dummy gate structure 140 may include a dummy gate insulation pattern 110, a dummy gate electrode 120 and the dummy gate mask 130 sequentially stacked on the active fin 105 and the isolation pattern. In an example embodiment, the dummy gate structure 140 may extend in the second direction, and a plurality of dummy gate structures 140 may be formed along the first direction.

The dummy gate insulation layer, the dummy gate electrode layer and the dummy gate mask layer may be formed by a chemical vapor deposition (CVD) process, an atomic layer deposition (ALD) process, etc. In an implementation, the dummy gate insulation layer may be formed by performing a thermal oxidation process on the upper portion of the substrate 100, and in this case, the dummy gate insulation layer may be formed only on an upper surface of the active fin 105.

The dummy gate insulation layer may include an oxide, e.g., silicon oxide, the dummy gate electrode layer may include, e.g., polysilicon, and the dummy gate mask layer may include a nitride, e.g., silicon nitride.

Figure 2:
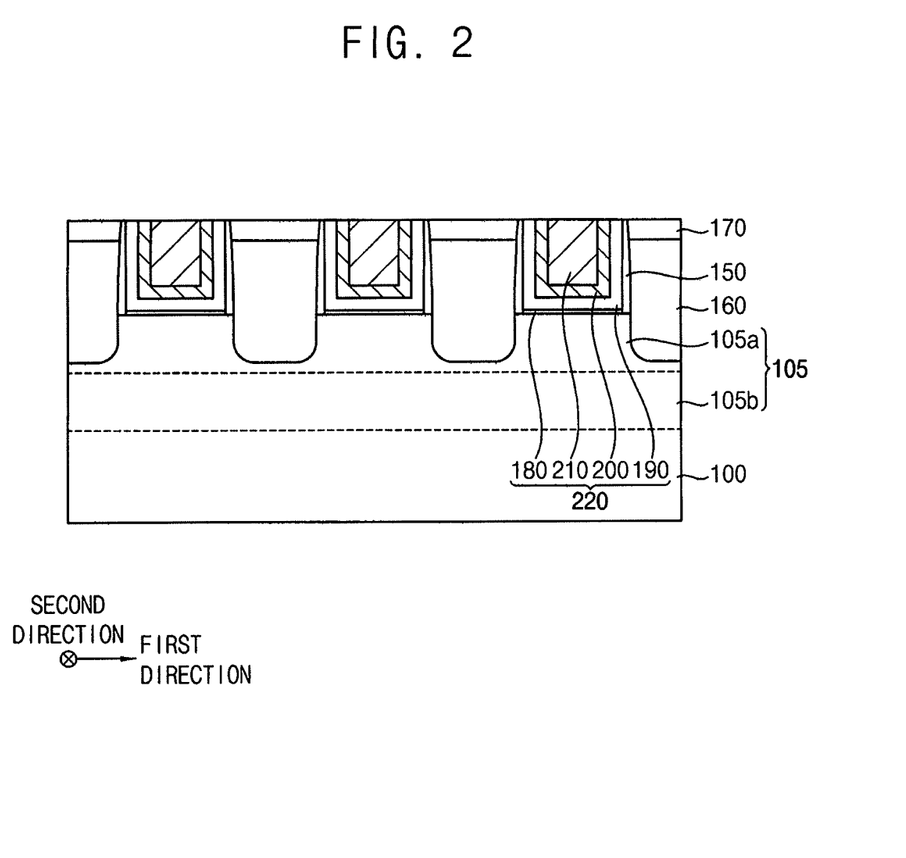

Referring to FIG. 2, a gate spacer 150 may be formed to cover a sidewall of the dummy gate structure 140, a source/drain layer 160 may be formed on the active fin 105 adjacent to the gate spacer 150, and a first insulating interlayer 170 covering the source/drain layer 160 and a sidewall of the gate spacer 150 may be formed on the active fin 105 and the isolation pattern.

The gate spacer 150 may be formed by forming a gate spacer layer on the active fin 105 and the isolation pattern to cover the dummy gate structure 140, and anisotropically etching the gate spacer layer. The gate spacer 150 may include a nitride, e.g., silicon nitride.

The source/drain layer 160 may be formed by removing an upper portion of the active fin 105 by a dry etching process using the dummy gate structure 140 and the gate spacer 150 on the sidewall of the dummy gate structure 140 as an etching mask to form a first recess, and filling the first recess. In an example embodiment, the source/drain layer 160 may be formed by performing a selective epitaxial growth (SEG) process using the upper surface of the active fin 105 exposed by the first recess as a seed.

In an example embodiment, the SEG process may be performed, and a single crystalline silicon-germanium layer may be formed to serve as the source/drain layer 160. A p-type impurity source gas may also be used in the SEG process, and a single crystalline silicon-germanium layer doped with p-type impurities may be formed to serve as the source/drain layer 160. Accordingly, the source/drain layer 160 may serve as a source/drain region of a positive-channel metal oxide semiconductor (PMOS) transistor.

The source/drain layer 160 may grow in a vertical direction and a horizontal direction to fill the first recess, and an upper portion thereof may grow to contact the sidewall of the gate spacer 150.

In an example embodiment, a plurality of source drain layers 160 may be formed along the second direction, and the source/drain layers 160 growing on the respective active fins 105 neighboring to each other in the second direction may be connected and merged.

The source/drain layer 160 serving as the source/drain of the PMOS transistor is described above. In another example embodiment, the source/drain layer 160 may be formed to serve as a source/drain of an NMOS transistor.

A single crystalline silicon carbide layer or a single crystalline silicon layer may be forming as the source/drain layer 160. The SEG process may be performed together with an n-type impurity source gas, and thus a single crystalline silicon carbide layer doped with n-type impurities or a single crystalline silicon layer doped with n-type impurities may be formed.

The first insulating interlayer 170 may be formed on the substrate 100 to cover the dummy gate structure 140, the gate spacer 150 and the source/drain layer 160, and an upper portion of the first insulating interlayer 170 may be planarized until an upper surface of the dummy gate electrode 120 in the dummy gate structure 140 may be exposed. The first insulating interlayer 170 may include an oxide, e.g., silicon oxide. The dummy gate mask 130 in the dummy gate structure 140 may be removed by the planarization process.

The exposed dummy gate electrode 120 and the dummy gate insulation pattern 110 thereunder may be removed to form a first opening exposing an inner sidewall of the gate spacer 150 and the upper surface of the active fin 105, and a gate structure 220 may be formed to fill the first opening.

The gate structure 220 may be formed by, e.g., the following processes. First, after performing a thermal oxidation process on the upper surface of the active fin 105 exposed by the first opening to form an interface pattern 180, a gate insulation layer and a work function control layer may be sequentially formed on the interface pattern 180, the isolation pattern, the gate spacer 150 and the first insulating interlayer 170, and a gate electrode sufficiently filling a remaining portion of the first opening may be formed on the work function control layer.

The gate electrode layer, the work function control layer and the gate insulation layer may be planarized until an upper surface of the first insulating interlayer 170 is exposed, so that a gate insulation pattern 190 and a work function control pattern 200 sequentially stacked may be formed on an upper surface of the interface pattern 180, an upper surface of the isolation pattern, and the inner sidewall of the gate spacer 150, and a gate electrode 210 may be formed on the work function control pattern 200 to fill the remaining portion of the first opening. Accordingly, a lower surface and a sidewall of the gate electrode 210 may be covered by the work function control pattern 200.

The interface pattern 180, the gate insulation pattern 190, the work function control pattern 200 and the gate electrode 210, sequentially stacked, may form the gate structure 220. The gate structure 220 may form a transistor together with the source/drain layer 160.

The interface pattern 180 may include an oxide, e.g., silicon oxide, the gate insulation pattern 190 may include a metal oxide, e.g., hafnium oxide, tantalum oxide, zirconium oxide, etc., the work function control pattern 200 may include a metal nitride, e.g., titanium nitride, tantalum nitride, tungsten nitride, etc., and the gate electrode 210 may include a low resistance metal, e.g., aluminum, copper, titanium, tantalum, etc., a nitride thereof, or an alloy thereof.

The transistor may form an NMOS transistor or a PMOS transistor according to the conductivity type of the source/drain layers 160.

Figure 3:
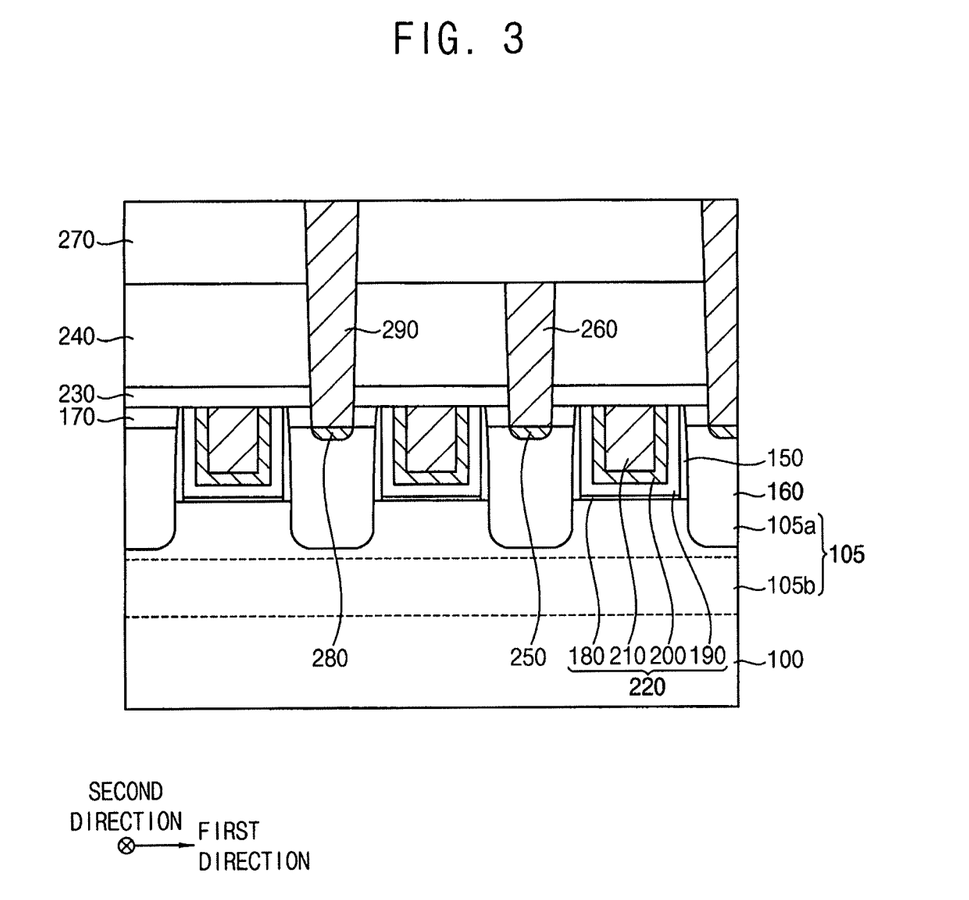

Referring to FIG. 3, an insulation layer 230 and a second insulating interlayer 240 may be sequentially formed on the first insulating interlayer 170, the gate structure 220 and the gate spacer 150, a source line 260 may be formed through the first insulating interlayer 170, the insulation layer 230 and the second insulating interlayer 240 to contact upper surfaces of one or ones of the source/drain layers 160 (hereinafter, referred to as a first source/drain layer).

The insulation layer 230 may include a nitride, e.g., silicon nitride. As compared with FIG. 3, the insulation layer 230 may be formed by removing an upper portion of the gate structure 220 to form a trench, and filling the trench.

Before forming the source line 260, a first metal silicide pattern 250 may be further formed on the first source/drain layer. Thus, a second opening may be formed through the first insulating interlayer 170, the insulation layer 230, and the second insulating interlayer 240 to expose the upper surface of the first source/drain layer, a first metal layer may be formed on the upper surface of the first source/drain layer, a sidewall of the second opening, and an upper surface of the second insulating interlayer 240, and a heat treatment process may be performed to form the first metal silicide pattern 250 on the first source/drain layer. The first metal silicide pattern 250 may include, e.g., nickel silicide, cobalt silicide, titanium silicide, etc.

The source line 260 may include a metal, a metal nitride, and/or polysilicon doped with impurities, and may further include a barrier pattern covering a lower surface and a sidewall of the source line 260. In an example embodiment, the source line 260 may extend to a given length in the second direction, and a plurality of source lines 260 may be formed along the first direction.

After forming a third insulating interlayer 270 on the second insulating interlayer 240 and the source line 260, a first contact plug 290 may be formed through the first insulating interlayer 170, the insulation layer 230, the second insulating interlayer 240, and the third insulating interlayer 270 to contact upper surfaces of one or ones of the source/drain layers 160 (hereinafter, referred to as a second source/drain layer).

A second metal silicide pattern 280 may be further formed between the first contact plug 290 and the second source/drain layer, and the first contact plug 290 may further include a barrier pattern covering a lower surface and a sidewall of the first contact plug 290.

Figure 4:
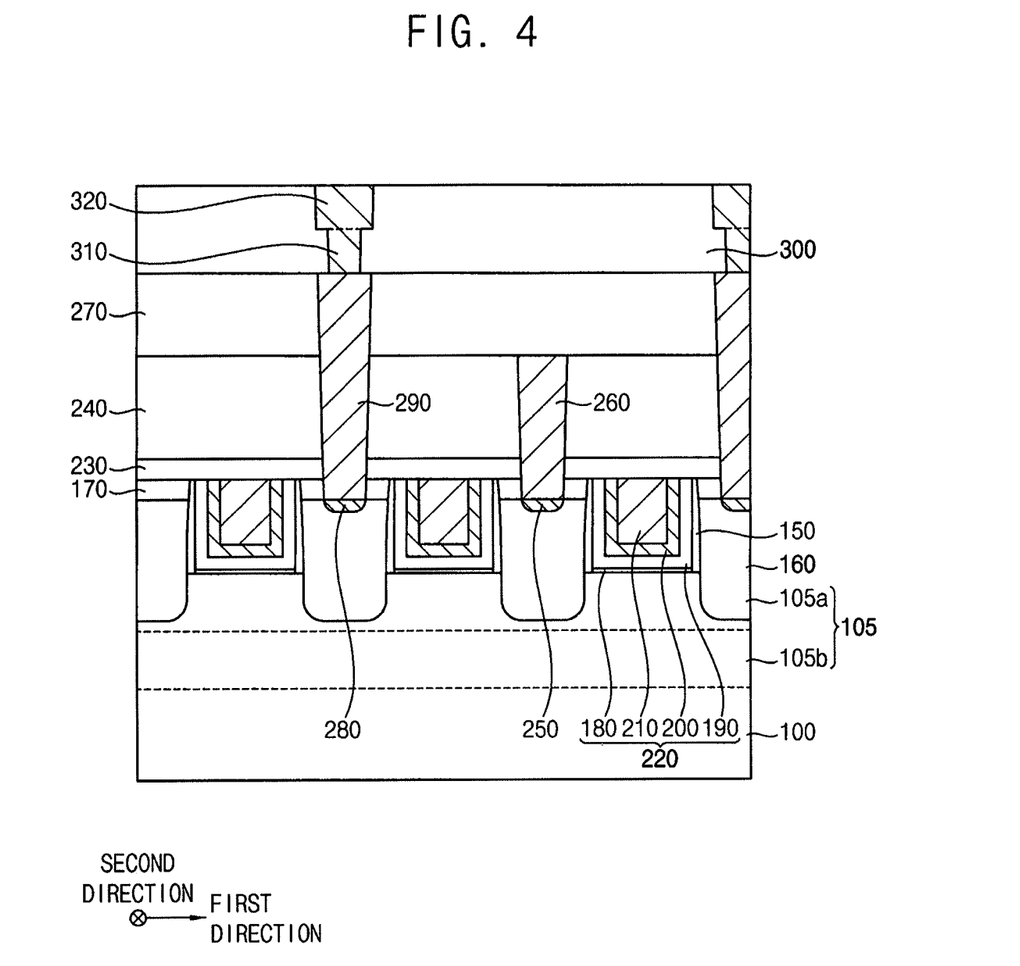

Referring to FIG. 4, after forming a fourth insulating interlayer 300 on the third insulating interlayer 270 and the first contact plug 290, a via 310 and a conductive line 320 sequentially stacked may be formed through the fourth insulating interlayer 300 to contact an upper surface of the first contact plug 290. The via 310 and the conductive line 320 sequentially stacked altogether may be referred to as a conductive structure.

In an example embodiment, the conductive line 320 and the via 310 may be simultaneously formed by a dual damascene process. In an implementation, the conductive line 320 and the via 310 may be independently formed by a single damascene process.

In an example embodiment, each of the conductive line 320 and the via 310 may include a low resistance metal, e.g., copper (Cu), aluminum (Al), etc.

Figure 5:
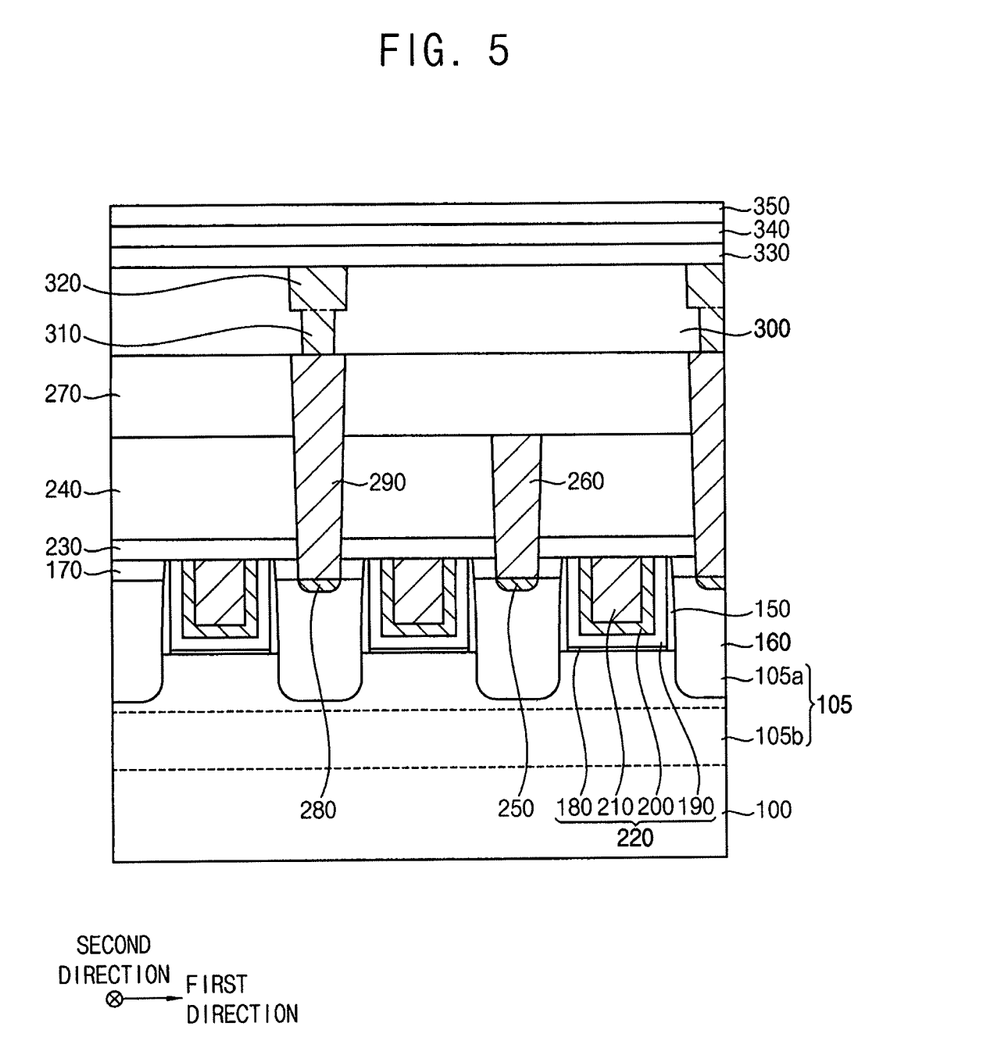

Referring to FIG. 5, a capping layer 330, a conductive layer 340, and an amorphous metal layer 350 may be sequentially formed on the fourth insulating interlayer 300 and the conductive line 320.

In an example embodiment, the capping layer 330 may include a metal compound, e.g., titanium nitride (TiN), tantalum nitride (TaN), tantalum boride (TaB), etc., the conductive layer 340 may include a metal, e.g., tungsten (W), aluminum (Al), copper (Cu), tantalum (Ta), etc., and the amorphous metal layer 350 may include a metal nitride, e.g., tantalum nitride (TaN), titanium nitride (TiN), etc.

Figure 6:
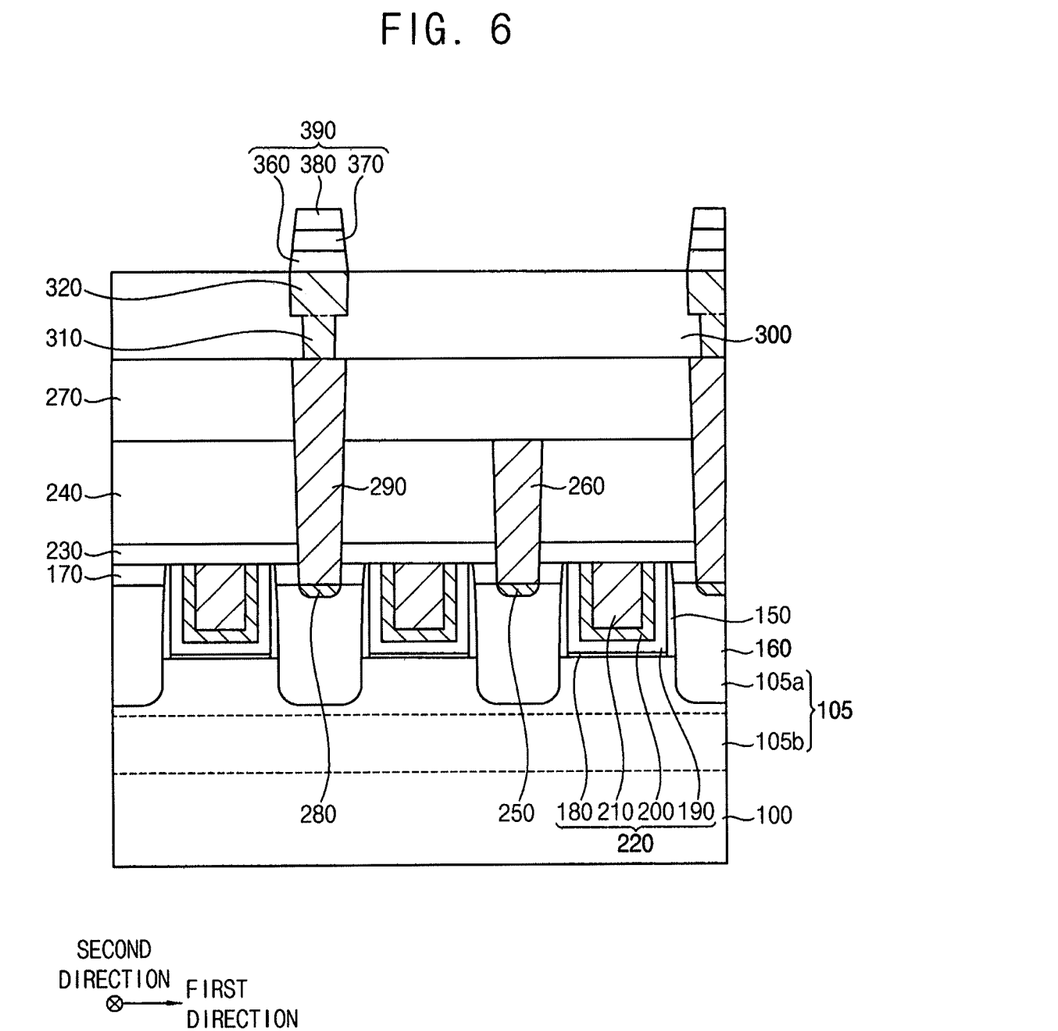

Referring to FIG. 6, the capping layer 330, the conductive layer 340 and the amorphous metal layer 350 may be patterned by an etching process using a photoresist pattern to form a second contact plug 390 including a capping pattern 360, a conductive pattern 370, and an amorphous metal pattern 380, sequentially stacked.

In an example embodiment, a sidewall of the second contact plug 390 may have a sidewall that is not vertical but is inclined to the upper surface of the substrate 100, and may have an area gradually increasing from an upper portion toward a lower portion thereof, and may be formed using, e.g., the characteristics of the etching process. Accordingly, an area of a lower surface of the second contact plug 390 may be greater than an area of an upper surface of the second contact plug 390.

In an example embodiment, the second contact plug 390 may be formed by a patterning process instead of a damascene process. If the second contact plug 390 were to formed by a damascene process, a recess on an insulating interlayer might not be completely filled, thus forming a void, and thus the second contact plug 390 may not be well connected to the conductive line 320 thereunder. For example, when the conductive line 320 includes, e.g., copper, and the second contact plug 390 includes a material different from the conductive line 320, e.g., tungsten, a poor junction between the dissimilar materials may occur. Additionally, copper included in the conductive line 320 may be eluted to neighboring layer structures through the void. However, in the present example embodiment, the second contact plug 390 may be formed by a patterning process, so that a void may not be formed, and the capping pattern 360 included in the second contact plug 390 may cover an upper surface of the conductive line 320, so that copper elution of the conductive line 320 may be decreased or prevented in a subsequent process.

In an example embodiment, the second contact plug 390 may have a small height, e.g., about 600 Å or less. As described above, a void may not be formed between the second contact plug 390 and the conductive line 320 thereunder, and thus, even if the second contact plug 390 has the small height, copper may be prevented from eluting from the conductive line 320.

Figure 7:
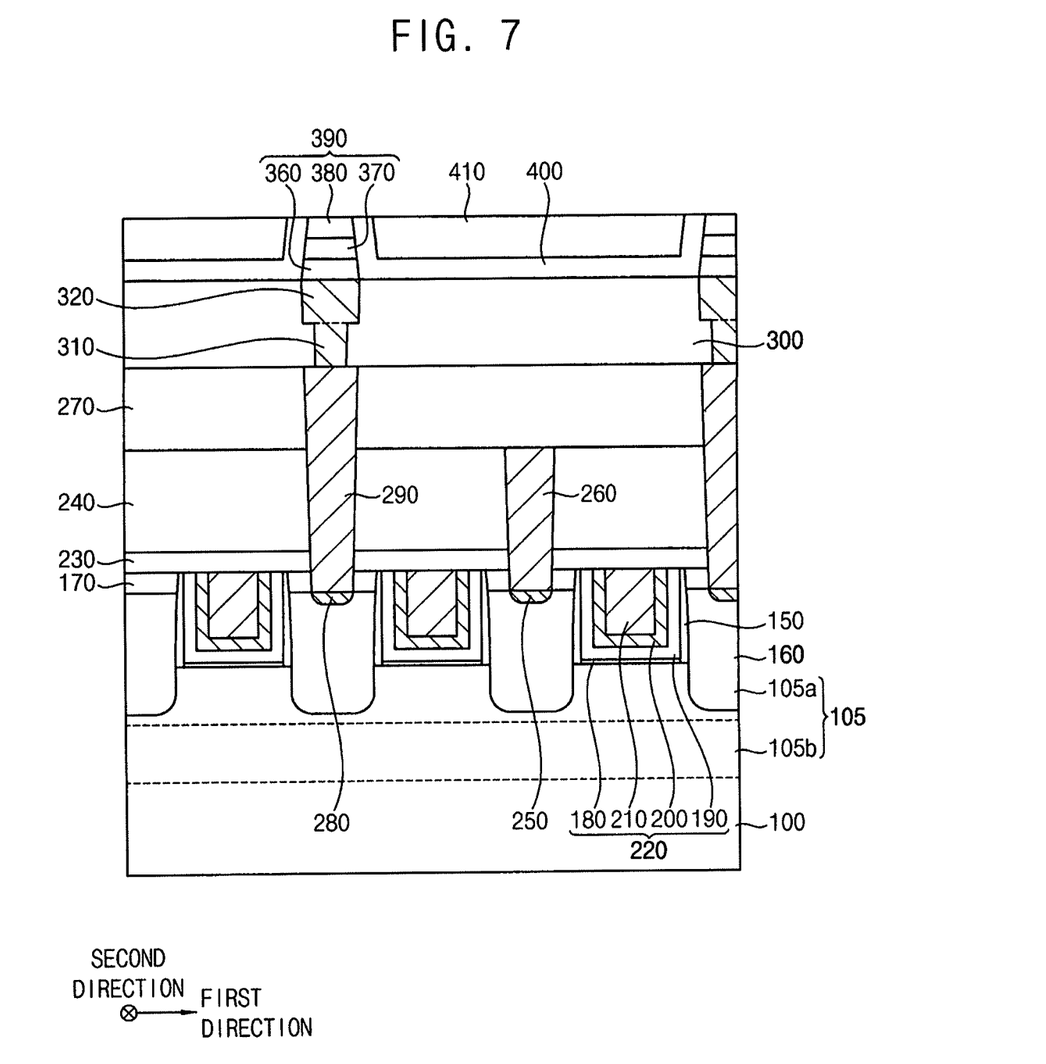

Referring to FIG. 7, a spacer layer 400 covering the second contact plug 390 may be formed on the fourth insulating interlayer 300, a fifth insulating interlayer 410 may be formed on the spacer layer 400, and the fifth insulating interlayer 410 and the spacer layer 400 may be planarized until the upper surface of the second contact plug 390 is exposed.

In an example embodiment, the spacer layer 400 may be conformally formed, and an upper portion of the spacer layer 400 may be removed by the planarization process, and thus the spacer layer 400 may be formed to cover the sidewall of the second contact plug 390 and an upper surface of the fourth insulating interlayer 300. The spacer layer 400 may include a nitride, e.g., silicon nitride (SiN), silicon carbonitride (SiCN), or silicon oxynitride (SiON), etc.

Figure 8:
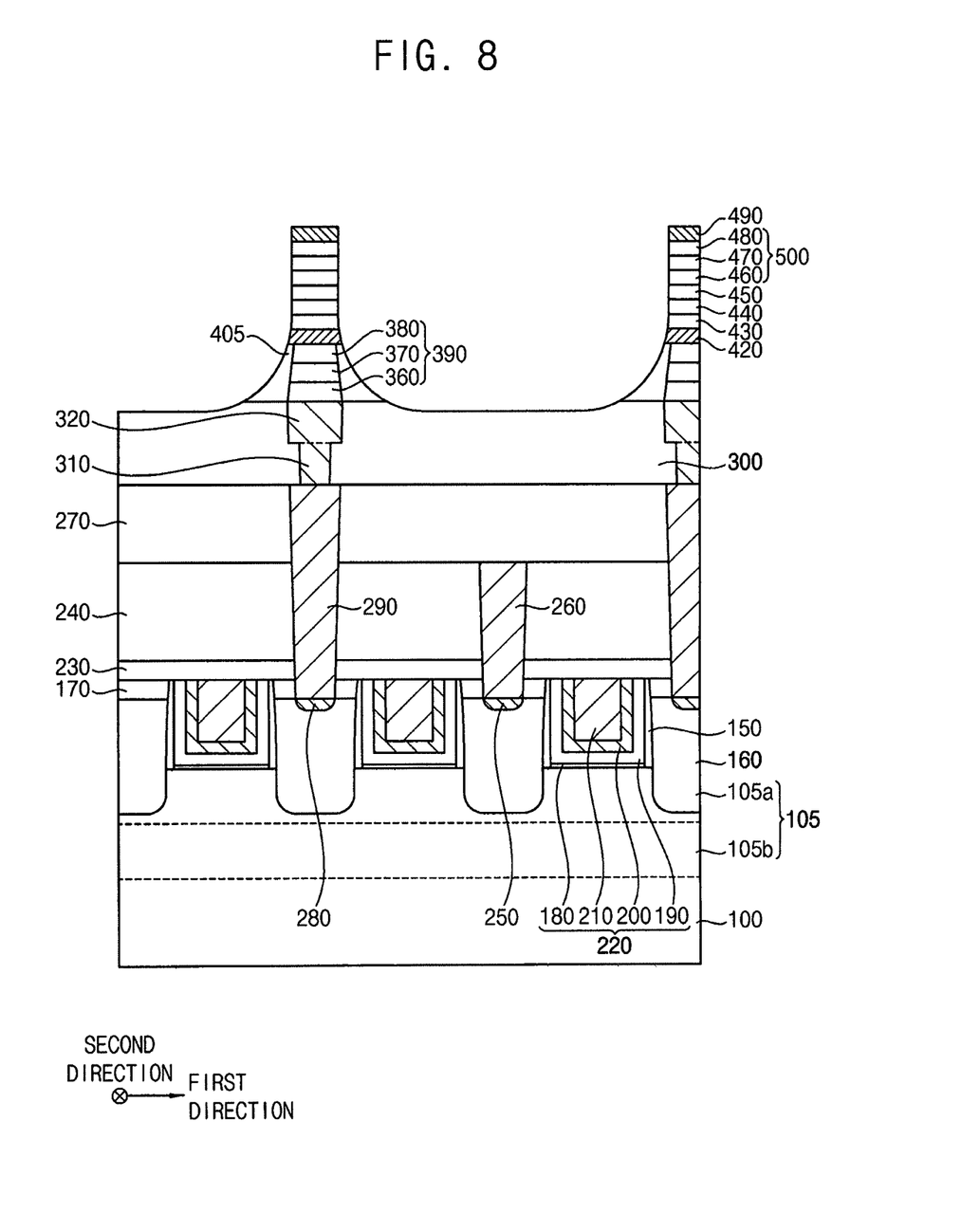

Referring to FIG. 8, a memory unit may be formed on the second contact plug 390.

A lower electrode layer, a blocking layer, an adhesion layer, a seed layer, an MTJ (magnetic tunnel junction) structure layer, and an upper electrode layer may be formed on the fifth insulating interlayer 410, the second contact plug 390, and the spacer layer 400. The lower electrode layer, the blocking layer, the adhesion layer, the seed layer, the MTJ structure layer, and the upper electrode layer may be etched by an etching process to form the memory unit. Accordingly, the memory unit may include a lower electrode 420, a blocking pattern 430, an adhesion pattern 440, a seed pattern 450, an MTJ structure 500, and an upper electrode 490 sequentially stacked on the second contact plug 390. The MTJ structure 500 may include a fixed layer pattern 460, a tunnel barrier pattern 470, and a free layer pattern 480.

The lower electrode 420 may include a metal nitride, e.g., titanium nitride (TiN), tantalum nitride (TaN), etc., the blocking pattern 430 may include a metal boride, e.g., tantalum boride (TaB), titanium boride (TiB), etc., a metal boronitride, e.g., tantalum boronitride (TaBN), titanium boronitride (TiBN), etc., or a metal compound, e.g., tantalum carbon fluoroborate (CFBTa), the adhesion pattern 440 may include a metal, e.g., tantalum (Ta), titanium (Ti), etc., and the seed pattern 450 may include a metal, e.g., ruthenium (Ru), rhenium (Re), etc.

The fixed layer pattern 460 may include a ferromagnetic material, e.g., cobalt (Co), platinum (Pt), iron (Fe), nickel (Ni), etc. In an example embodiment, the fixed layer pattern 460 may include an alloy of cobalt and platinum, i.e., CoPt, or a multi-layered structure including a cobalt layer and a platinum layer alternately stacked. The tunnel barrier pattern 470 may include, e.g., magnesium oxide (MgO) or aluminum oxide ($Al_2O_3$), and the free layer pattern 480 may include a ferromagnetic material, e.g., cobalt (Co), platinum (Pt), iron (Fe), nickel (Ni), etc.

In an example embodiment, the MTJ structure 500 may include the free layer pattern 480, the tunnel barrier pattern 470, and the fixed layer pattern 460, sequentially stacked, at least one of which may be formed to include a plurality of layers sequentially stacked.

The upper electrode layer 490 may include a metal, e.g., titanium, tantalum, tungsten, etc., and/or a metal nitride, e.g., titanium nitride, tantalum nitride, tungsten nitride, etc.

The second contact plug 390 may include the amorphous metal pattern 380 at an upper portion thereof. Thus, when the MTJ structure 500 is formed, the crystallinity of a lower structure, e.g., the conductive pattern 370 may not be transferred thereto.

During the etching process for forming the memory unit, the fifth insulating interlayer 410 and the spacer layer 400 may also be partially etched, and an upper portion of the fourth insulating interlayer 300 may also be partially etched. The spacer layer 400 may be transformed into a first spacer 405 covering the sidewall of the second contact plug 390. In an example embodiment, the first spacer 405 may have a width gradually increasing from an upper portion toward a lower portion thereof.

A sixth insulating interlayer covering the memory unit and the first spacer 405 may be formed on the fourth and fifth insulating interlayers 300 and 410, which may complete the fabrication of the semiconductor device.

As described above, the second contact plug 390 may be formed by a patterning process instead of a damascene process. Thus, the second contact plug 390 may be formed to be well connected to the conductive line 320 without a void therebetween. Accordingly, copper included in the conductive line 320 may not be eluted to neighboring layer structures. The second contact plug 390 may include the capping pattern 360 covering the upper surface of the conductive line 320, which may further reduce the elution of copper included in the conductive line 320 in a subsequent process.

FIGS. 9 to 12 are cross-sectional views illustrating a method of manufacturing a semiconductor device in accordance with an example embodiment. This example embodiment of the semiconductor device may be substantially the same as or similar to the semiconductor device described in FIGS. 1 to 8, except for further including a peripheral circuit region. Accordingly, like reference numerals refer to like elements, and detailed descriptions thereon may not be repeated herein.

Figure 9:
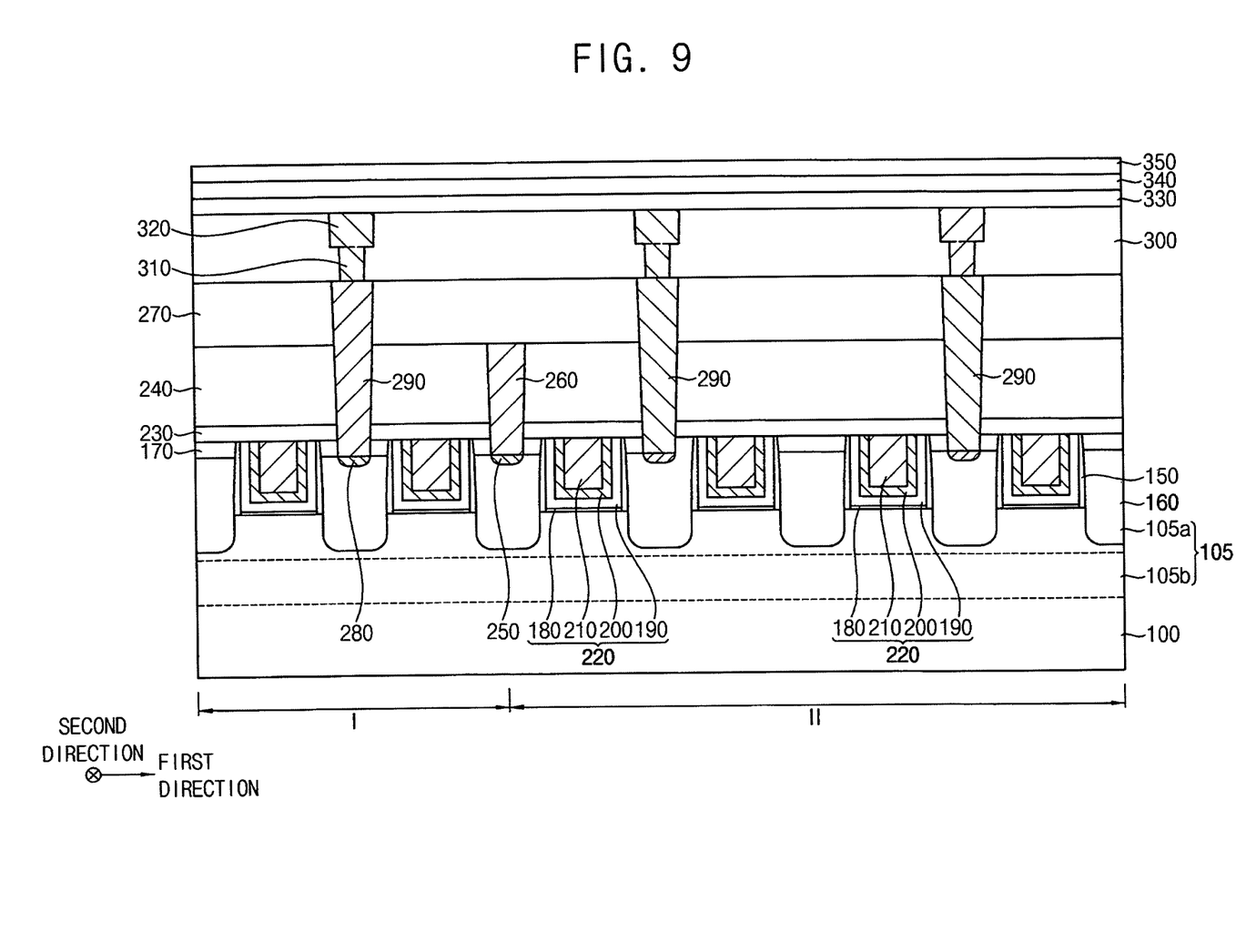
FIGS. 9 to 12 illustrate cross-sectional views of a method of manufacturing a semiconductor device in accordance with an example embodiment.

Referring to FIG. 9, processes substantially the same as or similar to the processes described in FIGS. 1 to 5 may be performed.

The substrate 100 may include first and second regions I and II, the gate structure 220, the first contact plug 290, the via 310, the conductive line 320, and the like, may be formed on each of the first and second regions I and II. In the present example embodiment, the source line 260 may be formed only on the first region I of the substrate 100.

In an example embodiment, the first region I of the substrate 100 may be a memory cell region in which memory cells may be formed, and the second region II of the substrate 100 may be a peripheral circuit region in which peripheral circuits may be formed.

The via 310 and the conductive line 320 on the first region I of the substrate 100 together may be referred to as a first conductive structure, and the via 310 and the conductive line 320 on the second region II of the substrate 100 together may be referred to as a second conductive structure.

Figure 10:
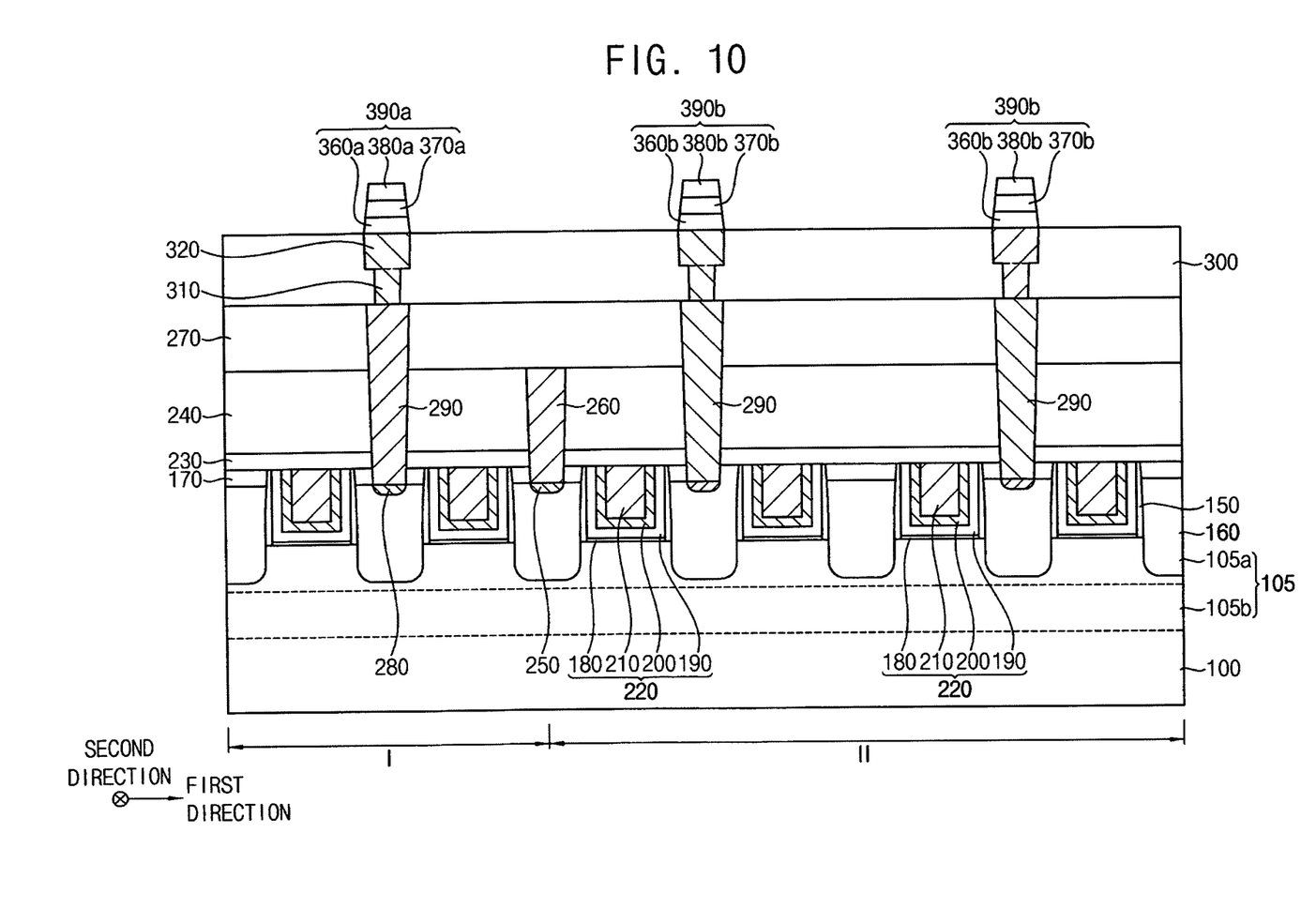

Referring to FIG. 10, processes substantially the same as or similar to the processes described in FIG. 6 may be performed.

Accordingly, a third contact plug 390a including a first capping pattern 360a, a first conductive pattern 370a, and a first amorphous metal pattern 380a, sequentially stacked, may be formed on the first conductive structure on the first region I of the substrate 100, and a fourth contact plug 390b including a second capping pattern 360b, a second conductive pattern 370b, and a second amorphous metal pattern 380b, sequentially stacked, may be formed on the second conductive structure on the second region II of the substrate 100.

Figure 11:
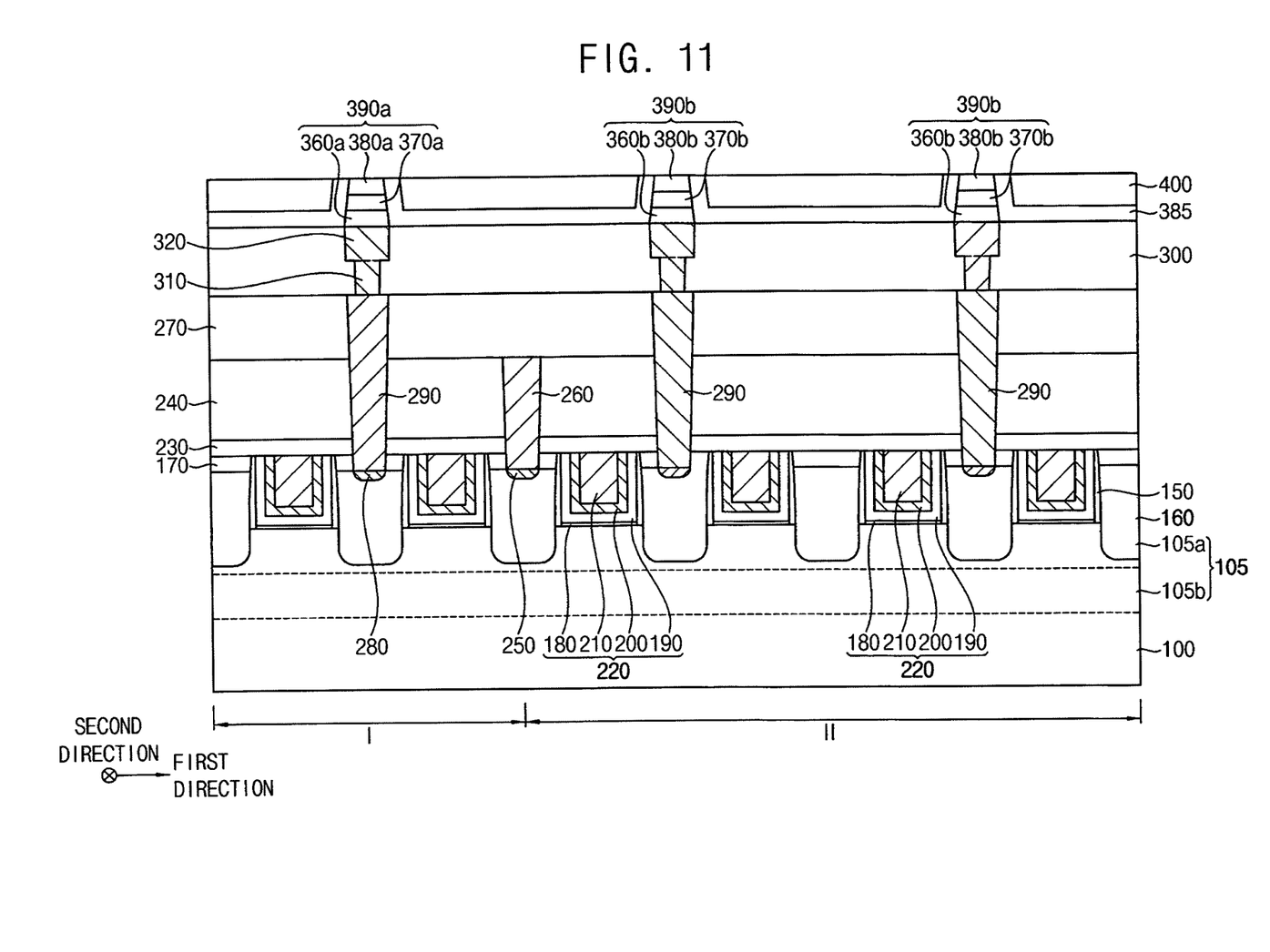

Referring to FIG. 11, processes substantially the same as or similar to the processes described in FIG. 7 may be performed.

Accordingly, the spacer layer 400 covering the third and fourth contact plugs 390a and 390b may be formed on the fourth insulating interlayer 300, the fifth insulating interlayer 410 may be formed on the spacer layer 400, and the fifth insulating interlayer 410 and the spacer layer 400 may be planarized until upper surfaces of the third and fourth contact plugs 390a and 390b are exposed.

Figure 12:
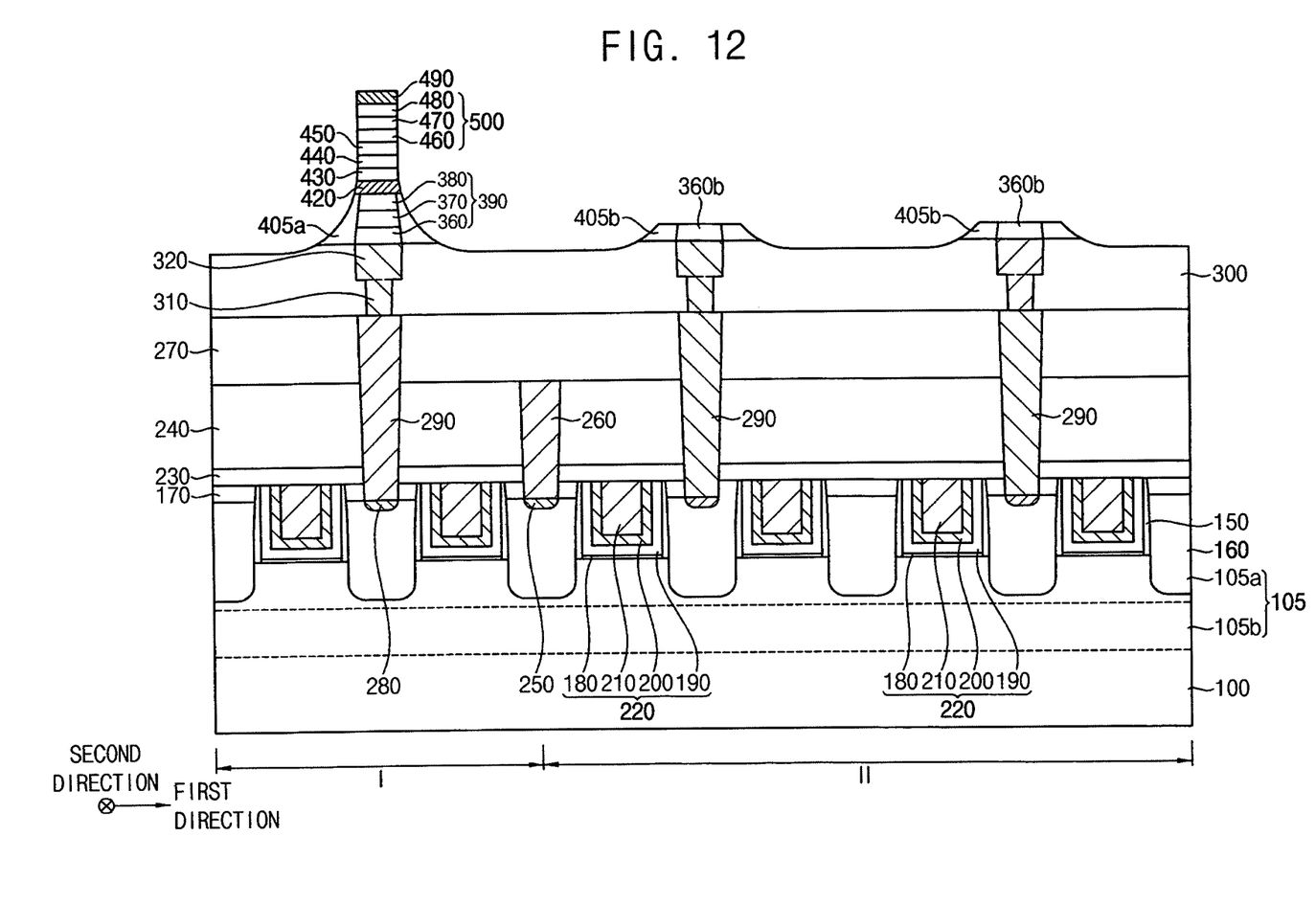

Referring to FIG. 12, processes substantially the same as or similar to the processes described in FIG. 8 may be performed.

Accordingly, a memory unit may be formed on the third contact plug 390a on the first region I of the substrate 100 to complete the fabrication of the semiconductor device.

During an etching process for forming the memory unit, the fifth insulating interlayer 410 and the spacer layer 400 may also be partially etched, and the upper portion of the fourth insulating interlayer 300 may also be partially etched. Further, the fourth contact plug 390b on the second region II of the substrate 100 may be partially removed.

Accordingly, a second spacer 405a may be formed to cover a sidewall of the third contact plug 390a on the first region I of the substrate 100, and a third spacer 405b may be formed to cover a sidewall of the fourth contact plug 390b on the second region II of the substrate 100. In an example embodiment, each of the second and third spacers 405a and 405b may have a width gradually increasing from an upper portion toward a lower portion.

In the etching process, the second amorphous metal pattern 380b of the fourth contact plug 390b may be removed, the second conductive pattern 370b may be partially or entirely removed, and the second capping pattern 360b may remain to cover the second conductive structure. The fourth contact plug 390b remaining on the second region II of the substrate 100 may have a lower surface lower than that of the third contact plug 390a on the first region I of the substrate 100, and the third spacer 405b may also have a lower surface lower than that of the second spacer 405a.

By way of summation and review, a conductive line may include, e.g., copper. If a void is formed between a contact plug and the conductive line, there may be no electrical connection therebetween, and in a subsequent process, the copper included in the conductive line may be eluted, which may result in an electrical short with a neighboring conductive structure.

As described above, embodiments relate to semiconductor devices including contact plugs. Embodiments may provide semiconductor devices having improved electrical characteristics. In a semiconductor device in accordance with an example embodiment, a contact plug may be formed by a positive patterning process instead of a damascene process, and the contact plug may be formed as a multi-layered structure, which may include a capping pattern at least partially covering an upper surface of a conductive structure, a conductive pattern on the capping pattern, and an amorphous metal pattern on the conductive pattern. Accordingly, the contact plug and the conductive structure thereunder may be formed to be well connected to each other without a void therebetween, and copper included in the conductive structure may not be eluted to a neighboring layer structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a conductive structure on a substrate;
a contact plug on the conductive structure, a lower surface of the contact plug having an area greater than that of an upper surface thereof, the lower surface being closer to the substrate than the upper surface, and the contact plug including:
a capping pattern at least partially covering an upper surface of the conductive structure;
a conductive pattern on the capping pattern; and
an amorphous metal pattern on the conductive pattern; and
a magnetic tunnel junction structure on the contact plug,
wherein the contact plug has a sidewall that is continuously inclined and not vertical to or parallel to an upper surface of the substrate, and has an area gradually increasing from an upper portion toward a lower portion thereof.

2. The semiconductor device as claimed in claim 1, wherein:
the capping pattern includes titanium nitride, tantalum nitride, or tantalum boride, and the conductive structure includes copper.

3. The semiconductor device as claimed in claim 1, wherein:
the conductive pattern includes tungsten, aluminum, copper, or tantalum, and the amorphous metal pattern includes tantalum nitride or titanium nitride.

4. The semiconductor device as claimed in claim 1, further comprising a spacer covering the sidewall of the contact plug, the spacer having a bottommost surface that is coplanar with a bottommost surface of the contact plug, and the spacer having a topmost surface that is coplanar with a topmost surface of the contact plug.

5. The semiconductor device as claimed in claim 4, wherein the spacer includes silicon nitride, silicon carbonitride, or silicon oxynitride.

6. The semiconductor device as claimed in claim 5, wherein the spacer includes a sidewall that is inclined and not vertical to the upper surface of the substrate.

7. The semiconductor device as claimed in claim 1, wherein the contact plug has a height of about 600 Å or less.

8. The semiconductor device as claimed in claim 1, wherein the magnetic tunnel junction structure includes a fixed layer pattern, a tunnel barrier pattern, and a free layer pattern, sequentially stacked.

9. The semiconductor device as claimed in claim 1, further comprising:
a lower electrode between the contact plug and the magnetic tunnel junction structure; and
an upper electrode on the magnetic tunnel junction structure.

10. A semiconductor device, comprising:
first and second conductive structures on a cell region and a peripheral circuit region, respectively, of a substrate;
a contact plug on the first conductive structure, a lower surface of the contact plug having an area greater than that of an upper surface thereof, the lower surface being closer to the substrate than the upper surface, and the contact plug including:
a first capping pattern at least partially covering an upper surface of the first conductive structure;
a first conductive pattern on the first capping pattern; and
an amorphous metal pattern on the first conductive pattern;
a magnetic tunnel junction structure on the contact plug; and
a second capping pattern at least partially covering an upper surface of the second conductive structure,
wherein the contact plug has a sidewall that is continuously inclined and not vertical to or parallel to an upper surface of the substrate, and has an area gradually increasing from an upper portion toward a lower portion thereof.

11. The semiconductor device as claimed in claim 10, further comprising:
a first spacer covering the sidewall of the contact plug; and
a second spacer on a sidewall of the second capping pattern,
wherein the first spacer has a bottommost surface that is coplanar with a bottommost surface of the contact plug, and the first spacer has a topmost surface that is coplanar with a topmost surface of the contact plug.

12. The semiconductor device as claimed in claim 11, wherein each of the first and second spacers includes silicon nitride, silicon carbonitride, or silicon oxynitride.

13. The semiconductor device as claimed in claim 11, wherein each of the first and second spacers has a sidewall that is inclined and not vertical to the upper surface of the substrate.

14. The semiconductor device as claimed in claim 10, further comprising a second conductive pattern on the second capping pattern.

15. The semiconductor device as claimed in claim 14, wherein an upper surface of the second conductive pattern is lower than an upper surface of the first conductive pattern.

16. The semiconductor device as claimed in claim 10, wherein:
the first capping pattern includes titanium nitride, tantalum nitride, or tantalum boride, and the first conductive structure includes copper.

17. The semiconductor device as claimed in claim 1, further comprising:
a gate structure on the substrate, at a level that is closer to the substrate than the conductive structure; and
a source/drain layer on a portion of the substrate adjacent to the gate structure, the source/drain layer being electrically connected to the conductive structure.

18. The semiconductor device as claimed in claim 17, further comprising a spacer covering the sidewall of the contact plug.

19. The semiconductor device as claimed in claim 17, further comprising:

a lower electrode between the contact plug and the magnetic tunnel junction structure; and an upper electrode on the magnetic tunnel junction structure.

\* \* \* \* \*